United States Patent [19]
Harding et al.

[11] 4,309,261
[45] Jan. 5, 1982

[54] METHOD OF AND APPARATUS FOR REACTIVELY SPUTTERING A GRADED SURFACE COATING ONTO A SUBSTRATE

[75] Inventors: Geoffrey L. Harding, Glebe; David R. McKenzie, Artarmon; Brian Window, Hornsby Heights; Anthony R. Collins, Paddington, all of Australia

[73] Assignee: University of Sydney, Sydney, Australia

[21] Appl. No.: 165,882

[22] Filed: Jul. 3, 1980

[51] Int. Cl.³ .............................................. C23C 15/00
[52] U.S. Cl. ........................... 204/192 R; 204/192 C; 204/192 P; 204/298
[58] Field of Search ........... 204/192 R, 192 C, 192 P, 204/298

[56] References Cited

U.S. PATENT DOCUMENTS

| | | | |
|---|---|---|---|
| 3,945,903 | 3/1976 | Svendor et al. | 204/192 P |
| 3,976,555 | 8/1976 | Von Hartel | 204/192 |
| 4,128,466 | 12/1978 | Harding et al. | 204/192 C |
| 4,166,784 | 9/1979 | Chapin et al. | 204/192 R |
| 4,194,962 | 3/1980 | Chambers et al. | 204/298 |

OTHER PUBLICATIONS

G. L. Harding et al., "Graded Metal Carbide Solar Selective Surfaces . . . ", *J. Vac. Sci. Technol.*, 16(6), Nov./Dec. 1979, pp. 2101–2103.
G. L. Harding, "Alternative Grading Profile for Sputtered Selective Surfaces", *J. Vac. Sci. Technol*, 16(6), Nov./Dec. 1979, pp. 2111–2113.
John A. Thornton et al., "Tubular Hollow Cathode Sputtering . . . ", *J. Vac. Sci. Technol.*, vol. 12, No. 1, Jan./Feb. 1975, pp. 93–97.

*Primary Examiner*—Delbert E. Gantz
*Assistant Examiner*—William Leader
*Attorney, Agent, or Firm*—Ladas & Parry

[57] ABSTRACT

A graded surface coating is reactively sputtered onto a tubular substrate by advancing the substrate in an axial direction through a cylindrical sputtering chamber in the presence of a sputter supporting gas. The sputtering chamber includes a cathode liner from which metal is sputtered onto the substrate. A reactive gas is directed into the sputtering chamber from a feed point outside of the chamber, whereby reactive sputtering occurs within the chamber. The reactive gas is induced to flow into the chamber in a direction counter to the direction of advancement of the substrate whereby, as the substrate is progressively advanced through the chamber and the applied coating gradually increases in thickness, the proportion of the reactive gas constituent in the coating increases relative to the metal constituent proportion with increasing thickness of the coating.

13 Claims, 2 Drawing Figures

METHOD OF AND APPARATUS FOR REACTIVELY SPUTTERING A GRADED SURFACE COATING ONTO A SUBSTRATE

FIELD OF THE INVENTION

This invention relates to a method of and apparatus for reactively sputtering a coating onto a surface. The invention has particular application to the deposition of solar absorbing or selective surface coatings onto substrates for use in solar collectors and, for convenience, the invention is hereinafter described in such context.

BACKGROUND OF THE INVENTION

In order to achieve efficient thermal conversion of solar energy in a solar collector, the collector element or elements should have a surface which has selective absorptance and reflectance. Thus, the surface should be capable of absorbing electromagnetic radiation of wavelength from about 0.3 $\mu$m. to about 2.0 $\mu$m. and of reflecting radiation which has a wavelength larger than about 2.0 $\mu$m. This requirement is met by applying an absorbing film (usually a refractory) of thickness between 0.02 and 0.20 $\mu$m. to a reflective surface coating of aluminium, silver, copper or other metal which has a thickness which is substantially non-transmissive of infra-red radiation.

The absorbing film preferably is graded in a manner such that its refractive index varies with thickness of the film. Thus, for example, in the case of a metal-carbide absorbing film, the volume ratio of the metal and carbon atoms is varied with depth of the film such that the metal atoms are more heavily concentrated at the interface of the absorbing film and the reflective surface or coating than at the outer surface of the film. Such films (including metal-carbides, metal-oxides, metal-nitrides, metal-silicides, etc.) which are deposited in a manner to provide for variation of refractive index with depth are generally and herein referred to as graded surface coatings.

OBJECT OF THE INVENTION

The present invention is directed to a method of and apparatus for applying a graded surface coating to a substrate by a reactive sputtering process. However, before proceeding to the specific nature of the present invention, a brief description is given in respect of known sputtering and reactive sputtering processes.

RELATED PRIOR ART

Sputtering is a process in which material is deposited onto a substrate in a sputtering chamber which houses an anode, a cathode, the substrate and a low pressure inert sputter-supporting gas. The depositing material is removed (i.e. sputtered) from the cathode by ion bombardment caused by the passage of electric current between the anode and the cathode, and the sputtered material forms a surface coating on the substrate. In a reactive sputtering process, a further gas (i.e. a reactive gas) is introduced into the sputtering region and a component of the reactive gas combines with the sputtered material to form a composite coating. The reactive gas is delivered direct to the sputtering chamber and the delivery rate determines the volume ratio of the depositing metal and reactive component of the gas. When a graded surface coating is to be produced, the rate of admission of the reactive gas is increased with increasing thickness of the coating.

SUMMARY OF THE INVENTION

The present invention distinguishes over the above discussed prior art in that a graded surface coating is applied to a substrate by advancing the substrate through a sputtering chamber and by causing a reactive gas to flow into the sputtering chamber in a direction counter to the direction of advancement of the substrate. The reactive gas is not fed directly into the sputtering chamber but is caused to flow into the chamber from a feed point located outside of the chamber.

Thus the invention may be defined as providing a method of applying a graded surface coating to a substrate and which comprises: advancing the substrate through a sputtering chamber in the presence of a sputter supporting gas and causing a reactive gas to flow into the sputtering chamber in a direction counter to the direction of advancement of the substrate.

The invention may be further defined as providing an apparatus for effecting the above defined method and which comprises: a sputtering chamber, means for admitting a sputter supporting gas to the chamber, means for advancing the substrate through the chamber, means for feeding a reactive gas into the sputtering chamber, and means for inducing flow of the reactive gas into the chamber in a direction counter to the direction of advancement of the substrate.

The reactive gas is caused to flow in the direction counter to that of advancement of the substrate in order that grading of the coating is achieved. That is, as the substrate is progressively advanced through the chamber the applied coating gradually increases in thickness and the proportion of the reactive gas constituent in the coating increases with increasing thickness of the coating. The refractive index of the coating is therefore graded so that values more characteristic of metals exist close to the coating-substrate interface and values more characteristic of dielectric materials are achieved closer to the coating surface.

The total thickness of the coating is controlled by adjusting the substrate translation rate and/or by adjusting the sputtering rate, the latter being determined by the cathode current. The flow rate of the reactive gas and/or the length of the cathode within the sputtering chamber is/are preferably chosen so that, during advancement of the substrate through the chamber, (a) the coating which is being deposited at a point farthest from the reactive gas feed point resembles a metallic coating, and, (b) the coating which is being deposited most near the reactive gas feed point contains the greatest possible concentration of reactive constituent, although the reactive gas concentration should not be so great as to impose an inhibiting (poisoning) effect on the cathode.

PREFERRED FEATURES OF THE INVENTION

The sputtering chamber preferably comprises a magnetron-type chamber which is surrounded by field windings and the cathode from which metal is sputtered preferably extends for substantially the whole length of the chamber.

The substrate may comprise metal or glass and, in the case of a solar collector fluid channel element, the substrate would normally be tubular. The substrate, particularly a glass substrate, may be pre-coated with a metal deposit and, in such case, the substrate may be advanced serially through two sputtering chambers. Thus, a substantially pure metal is sputtered onto the substrate during advancement of the substrate through the first of two sputtering chambers, and a graded surface coating is reactively sputtered onto the substrate during its advancement through the second chamber. The flow rate of the reactive gas is determined so that the reactive constituent of the reactive gas is totally or largely "consumed" within the second sputtering chamber, and any residual reactive constituent is consumed adjacent the exit end of the first chamber.

When two sputtering chambers are employed, electrode (cathode) materials and reactive gases as listed in the following Table 1A may be employed.

TABLE 1A

| First Chamber Electrode | Second Chamber Electrode | Reactive Gas/ Constituent |
|---|---|---|
| Copper | Iron | Carbon* |
| Manganese | Chromium | Carbon* |
| Nickel | Vanadium | Carbon* |
| Cobalt | Zirconium | Carbon* |
| Silver | Molybdenum | Carbon* |
| Gold | Tungsten | Carbon* |
| Germanium | Titanium | Carbon* |
| Lead | Tantalum | Carbon* |
| Copper | Nickel | Carbon* |
| Chromium | Aluminium | Oxygen |
| Iron | Titanium | Oxygen |
| Nickel | Zirconium | Oxygen |
| Silver | Silicon | Oxygen |
| Gold | Magnesium | Oxygen |
| Lead | Barium | Oxygen |
| Copper | Tantalum | Nitrogen |
| Nickel | Vanadium | Nitrogen |
| Chromium | Titanium | Nitrogen |
| Molybdenum | Tungsten | Nitrogen |
| Tungsten | Zirconium | Nitrogen |
| Antimony | Barium | Nitrogen |
| Copper | Cobalt | Silicon + |
| Silver | Chromium | Silicon + |

*Derived from, e.g. Acetylene
+ Derived from, e.g. Silane

The preceding tabulation is non-exhaustive and any one of the elements shown in the left-hand column of the table may be used in conjunction with any one of the elements shown in the centre column, provided that an appropriate reactive gas is employed. Also, the material selected for the first electrode may be the same as the material of the second electrode, provided that the material forms a stable compound with the reactive gas. The electrodes need not necessarily be constituted by elements as such. One or other or both of the electrodes may be formed from an alloy as indicated in the following non-exhaustive Table 1B.

TABLE 1B

| First Chamber Electrode | Second Chamber Electrode | Reactive Gas Constituent |
|---|---|---|
| Inconel 600 | Stainless Steel 316 | Carbon |
| Copper | Stainless Steel | Carbon |

The invention will be more fully understood from the following description of a preferred embodiment of an apparatus for working the invention, the description being given with reference to the accompanying drawings.

DETAILED DESCRIPTION OF THE INVENTION

The illustrated apparatus comprises two spaced-apart sputtering chambers 10 and 11 which respectively are termed first and second sputtering (or cathode) chambers, and a substrate to be coated is passed serially through the first and second chambers. The substrate may comprise a cylindrical glass tube which, while being moved axially through the apparatus, has a graded coating applied to its outer surface by a reactive sputtering process.

Figure 1:
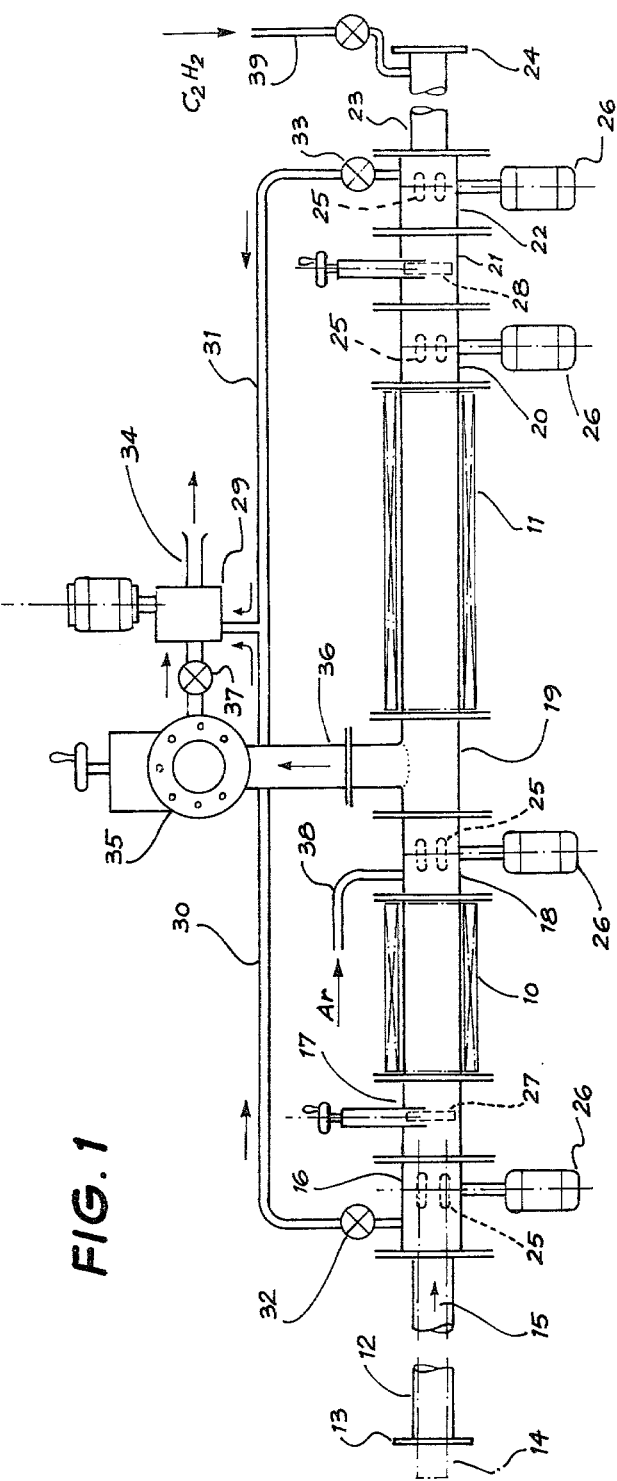
FIG. 1 shows an elevation view of a d.c. sputtering apparatus which provides for movement of a substrate relative to sputtering chambers of the apparatus.

A loading chamber 12 is located at one end (the left-hand end as viewed in FIG. 1) of the apparatus, and a pivotable end cap 13 is fitted to the chamber. The loading chamber is sized to receive wholly a tubular substrate 14 (shown in dotted outline) which is to be coated. The tubular substrate is transported through the apparatus in the direction indicated by the arrow 15 in FIG. 1.

Located between the loading chamber 12 and the first sputtering chamber 10 is a first transport roller housing 16 and a first gate valve housing 17. Then, between the first and second cathode chambers 10 and 11 are located a second transport roller housing 18 and an evacuation chamber 19. Finally, extending serially beyond the second cathode chamber 11 are a third transport roller housing 20, a second gate housing 21, a fourth transport roller housing 22 and an unloading chamber 23. The unloading chamber 23 is similar to the loading chamber 12 and is fitted with a pivotable sealing cap 24.

The first, second, third and fourth roller housings 16, 18, 20 and 22 all house rollers 25 which support the tubular substrate 14 and move it progressively through the apparatus. Also, spring loaded pinch rollers (not shown) are located within the first roller housing 16. Drive for each of the rollers 25 is obtained from stepping motors 26 which are mounted to the respective housings, and the stepping motors are electrically connected and energised so as to turn in synchronism.

Manually operable or electro-mechanically operable gate valves 27 and 28 are located in the housings 17 and 21. The respective valves are acutated to a closed position during loading and unloading of the tubular substrate, so that a high vacuum is maintained within the cathode chambers 10 and 11 of the apparatus.

A rotary pump 29 is coupled to the roller housings 16 and 22 by vacuum lines 30 and 31, and solenoid operated valves 32 and 33 are located in the respective lines. The pump discharges to atmosphere by way of conduit 34.

Also, a diffusion pump 35 is coupled to the evacuation chamber 19. The diffusion pump connects with the evacuation chamber by way of a vacuum line 36 and it discharges to atmosphere by way of a solenoid actuated valve 37 and the rotary pump 29.

Sputter supporting (Argon) gas is delivered to the first and second cathode chambers 10 and 11 by way of a delivery line 38, which couples with the interior of the roller housing 18, and reactive (Acetylene) gas is delivered to the apparatus by way of a valved delivery line 39. The Acetylene gas is delivered to the apparatus adjacent the free end of the unloading chamber 23.

All of the above described chambers and housings have a circular cross-section and are located in axial alignment, with appropriate seals being located between abutting flanges of each of the housings and chambers.

The first and second cathode chambers 10 and 11 are constructed in a similar manner, with the only significant differences between them being:

(a) The first cathode chamber 10 contains a copper cathode in the form of a copper liner for the chamber, and (b) The second cathode chamber 11 is approximately double the length of the first cathode chamber 10 and contains an iron-chromium-nickel alloy cathode in the form of a stainless steel liner.

Figure 2:
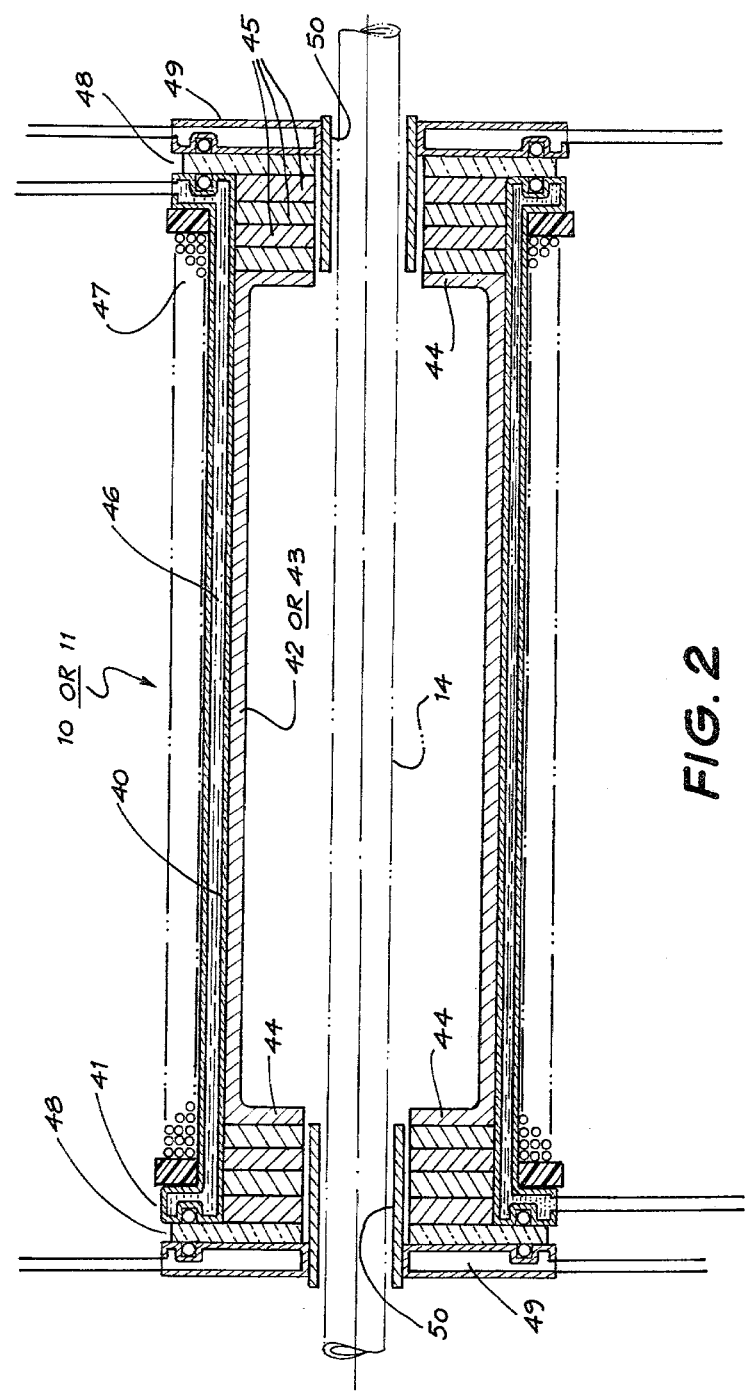
FIG. 2 shows a detailed sectional elevation view of one or the other of the sputtering chambers in the apparatus of FIG. 1.

FIG. 2 shows a sectional elevation view of the first cathode chamber 10, or alternatively, of the second cathode chamber 11.

As illustrated, the chamber 10 or 11 comprises a stainless steel casing 40 which is formed with integral end flanges 41. A copper or stainless steel liner 42 or 43 is press-fitted within the casing 40, such liner having inwardly directed end flanges 44 and annular form mild-steel pole pieces 45 are located within the casing in abutment with the liner end flanges 44.

A water jacket 46, through which coolant water is passed, is located about the casing 40, and a three-layer solenoid coil 47 is wound about the water jacket. The coil 47 is insulated from adjacent metal by an insulating material.

A centrally apertured glass disc 48 is mounted to each end of the casing 40, and a water-cooled anode 49 clamps each of the glass discs to the casing 40. Each anode 49 is formed from copper and is formed generally as a disc. However, each anode has a central aperture, which is fitted with an internal sleeve 50 which projects towards the cathode region and locates within the adjacent pole pieces 45.

A negative potential is applied to the cathode material 42 or 43 by way of the casing 40, and a zero potential is applied to each of the anodes 49.

Appropriate water supply and discharge lines are connected to the water jacket 46 and to the anodes 49.

The parameters of construction and operation of the above described apparatus are set out in the following Table 2:

TABLE 2

| | |
|---|---|
| Substrate (14) | Glass tube, 20 to 35 mm O.D. × 1500 mm long. |
| First cathode (42) material | Copper |
| Second cathode (43) material | 316 Stainless steel |
| I.D. of first cathode (42) | 93 mm |
| Length of first cathode (42) | 130 mm |
| I.D. of second cathode (43) | 93 mm |
| Length of second cathode (43) | 265 mm |
| Center distance between cathodes | 700 mm |
| Cathode-Substrate spacing | 30 mm |
| Current to first cathode (42) | 2 amperes (typical) |
| Current to second cathode (43) | 4 amperes (typical) |
| Magnetic field strength, adjacent each cathode | 0.057 Tesla |
| Substrate (14) translation velocity | 3.95 mm s$^{-1}$ |
| Sputtering gas | Argon |
| Reactive gas | Acetylene |
| Reactive gas flow rate | 2.7 × 10$^{-7}$m$^3$s$^{-1}$ at S.T.P. |
| Sputtering gas (Argon) pressure to first cathode chamber (10) | 0.80 Pa |
| Sputtering gas (Argon) pressure to second cathode chamber (11) | 0.40 Pa |
| Total gas (Argon & Acetylene) pressure to first cathode chamber (10) | 1.10 Pa* |
| Total gas (Argon & Acetylene) pressure to second cathode chamber (11) | 2.00 Pa* |
| Cathode (first and second) potential | −600V (approx.) |
| Anode potential | 0 V |

*At right-hand end of chambers, before commencement of sputtering.

In operation of the apparatus which has been described thus far, the gate valve 27 is closed, the valve 32 is closed, the end cap 13 is opened and a tubular substrate 14 which is to be coated is fed into the loading chamber 12.

Thereafter, the cap 13 is closed, the valve 32 is opened, the loading chamber 12 is evacuated and, following evacuation of the chamber, the valve 27 is opened. Then, the valve 32 is closed.

When the cathode chambers have been evacuated, the sputter supporting (Argon) gas is admitted by way of conduit 38 to establish the above tabulated chamber pressures. The difference in working pressures is achieved by virtue of the closer proximity of the gas inlet to the first chamber 10 than to the second chamber 11 and due to the intermediate position of the evacuation chamber 19. At the same time, the magnet field windings are excited for the purpose of confining mobile electrons near to the cathodes within the respective chambers 10 and 11, and the negative potential is applied to each of the cathodes 42 and 43.

Also, the reactive (Acetylene) gas is admitted to the apparatus by way of the valved conduit 39. The gate valve 28 being open, the reactive gas flows towards the evacuation chamber 19 by way of the second chamber 11 and a small proportion of the reactive gas migrates into the first chamber 10.

During operation of the apparatus, the sputter supporting and reactive gas flow rates are not varied, and nor are the excitation potentials at the respective chambers varied.

Having established the required sputtering conditions, the substrate 14 is advanced progressively through the apparatus by exciting the stepping motors 26.

Due to the position of the entry point of the reactive (Acetylene) gas, the carbon atoms in the reactive gas are largely "consumed" within the second cathode chamber 11, and any residual reactive gas carbon atoms are "consumed" in the right-hand end region of the first cathode chamber 10. This results in a high concentration of carbon or carbides in the surface region of the deposited coating and a progressively decreasing incidence of carbon or carbides in the coating "layers" which lay nearer the substrate.

Thus, as the substrate is advanced through the apparatus, a substantially pure copper coating is first applied to the substrate and, thereafter, a graded coating which comprises copper in a mixed matrix of iron, chromium and nickel carbides is applied.

When the substrate has been advanced through the first and second chambers 10 and 11 into the unloading chamber 23, the gate valve 58 is closed, the solenoid operated valve 33 is retained closed (as it has been during the preceding operations) and the chamber cap 24 is opened to permit removal of the coated substrate. Thereafter, the valve 33 is opened, the gate valve 58 is opened, the valve 33 is closed and the procedure is repeated with insertion of a new substrate tube.

An apparatus of the type above described has been employed to produce a solar selective coating which has a solar absorptance of 0.90 and a thermal emittance of 0.04 after heating in vacuum at 500° C. for one hour and then at 380° C. for one hour.

The foregoing description has been given in the context of a laboratory apparatus and procedure, but it will be appreciated that, with variations and modifications made in the described apparatus, the invention may be applied to commercial procedures for coating tubular substrates for use in solar collectors.

A substantially continuous coating process may be effectd if multi-barrel in-feed and out-feed chambers are mounted to the respective ends of the appartatus, with such chambers being mounted to the apparatus as rotatably positionable turrets. Also, the substrate 14 may be rotated about its own axis during advancement of the substrate through the apparatus. This may be achieved by orientating the rollers 25 at an acute angle to the direction of advancement of the substrate, whereby rotational and rectilinear movement is imparted to the substrate.

We claim:

1. A method of applying a graded surface coating to a substrate and which comprises:

advancing the substrate through a sputtering chamber in the presence of a sputter supporting gas, sputtering metal onto the substrate from a cathode within the chamber, directing a reactive gas into the chamber whereby reactive sputtering occurs within the chamber, and inducing the reactive gas to flow into the chamber in a direction counter to the direction of advancement of the substrate whereby, as the substrate is progressively advanced through the chamber, the applied coating gradually increases in thickness and the proportion of the reactive gas constituent in the coating increases relative to the metal constituent proportion in the coating with increasing thickness of the coating.

2. The method as claimed in claim 1 wherein the reactive gas is directed into the sputtering chamber from a feed position spaced from the sputtering chamber.

3. The method as claimed in claim 1 or claim 2 wherein the substrate is advanced into the sputtering chamber from a loading chamber, wherein the substrate is thereafter advanced into an unloading chamber from the sputtering chamber, and wherein the reactive gas is directed into the sputtering chamber by way of the unloading chamber.

4. The method as claimed in claim 1 or claim 2 wherein the said sputtering chamber comprises a second sputtering chamber, wherein a first sputtering chamber is located in series with the second sputtering chamber, wherein the substrate is advanced through the first sputtering chamber before being advanced into and through the second sputtering chamber, and wherein the reactive gas is directed into the second sputtering chamber at a rate such that the reactive constituent of the reactive gas is substantially entirely consumed in the reactive sputtering process in the second sputtering chamber.

5. An apparatus for applying a graded surface coating to a substrate and which comprises:

a sputtering chamber, means for admitting a sputter supporting gas to the chamber, means for advancing the substrate through the chamber, a cathode located within the chamber and extending lengthwise of the chamber in the direction of advancement of the substrate through the chamber, means for directing a reactive gas into the chamber, the means for directing the reactive gas into the chamber being separate from the means for admitting the sputter supporting gas to the chamber and including a feed point which is spaced from the chamber in the direction of advancement of the substrate through the chamber.

6. The apparatus as claimed in claim 5 and including a loading chamber communicating with and located in series with the sputtering chamber, an unloading chamber communicating with and located in series with the sputtering chamber, and means for advancing the substrate from the loading chamber to the unloading chamber by way of the sputtering chamber.

7. The apparatus as claimed in claim 5 wherein the said sputtering chamber comprises a second sputtering chamber, wherein a first sputtering chamber is located in series with the second sputtering chamber, wherein means are provided for advancing the substrate successively through the first and second sputtering chambers, and wherein means are provided for directing the reactive gas into the second sputtering chamber at a rate such that the reactive constituent of the reactive gas is substantially wholely consumed in a reactive sputtering process in the second sputtering chamber and such that non-reactive sputtering occurs within at least a major portion of the first sputtering chamber.

8. An apparatus for applying a graded solar selective surface coating to a substrate and which comprises:

a first sputtering chamber, a second sputtering chamber which is located in series with the first sputtering chamber, means for advancing the substrate serially through the first and second sputtering chambers at a predetermined feed-rate, a cathode located within each of the first and second sputtering chambers and extending lengthwise of the respective sputtering chambers in the direction of advancement of the substrate through the sputtering chambers, means for admitting a sputter supporting gas to the first and second sputtering chambers, means for directing a reactive gas into the second sputtering chamber at a rate such that the reactive constituent of the reactive gas is substantially entirely consumed in a reactive sputtering process in the second sputtering chamber, the means for directing the reactive gas into the second sputtering chamber being separate from the means for admitting the sputter supporting gas and including a feed point which is spaced from the second sputtering chamber in the direction of advancement of the substrate, and means for inducing a flow of the reactive gas into the cathode containing region of the second sputtering chamber in a direction counter to the direction of advancement of the substrate through the chamber.

9. The apparatus as claimed in claim 8 wherein the means for inducing flow of the reactive gas includes an evacuation chamber which is located intermediate the first and second sputtering chamber.

10. The apparatus as claimed in claim 8 wherein each of the first and second sputtering chambers comprises a generally cylindrical chamber through which the substrate is advanced in an axial direction, and wherein the cathode in each sputtering chamber is in the form of a chamber liner.

11. The apparatus as claimed in claim 10 wherein the first sputtering chamber has an axial length less than that of the second sputtering chamber and wherein, in operation of the apparatus, the substrate is advanced through the sputtering chambers at a substantially constant velocity.

12. The apparatus as claimed in claim 10 wherein the cathode liner in the first sputtering chamber comprises a copper liner and the liner in the second sputtering chamber comprises a stainless steel liner.

13. The apparatus as claimed in claim 8 wherein the cathode in each of the sputtering chambers comprises a tubular form liner through which the substrate can be advanced in an axial direction, and wherein each of the sputtering chambers is surrounded by a field winding which, when excited, creates a sputter confining magnetic field within the chamber.

* * * * *